United States Patent [19]

Kamada

[11] Patent Number: 5,450,415
[45] Date of Patent: Sep. 12, 1995

[54] BOUNDARY SCAN CELL CIRCUIT AND BOUNDARY SCAN TEST CIRCUIT

[75] Inventor: Takehiro Kamada, Osaka, Japan

[73] Assignee: Matsushita Electric Industrial Co., Ltd., Osaka, Japan

[21] Appl. No.: 155,168

[22] Filed: Nov. 19, 1993

[30] Foreign Application Priority Data

Nov. 25, 1992 [JP] Japan ................................. 4-314734

[51] Int. Cl.$^6$ ............................................ H04B 17/00
[52] U.S. Cl. ................................. 371/22.3; 371/22.1; 371/22.5; 371/22.6; 371/27
[58] Field of Search ...................... 371/22.3, 10.1, 22.1, 371/22.5, 22.6, 27; 324/158 R; 257/48; 307/272.2

[56] References Cited

U.S. PATENT DOCUMENTS

| | | | |
|---|---|---|---|
| 4,298,980 | 11/1981 | Hajdu et al. | 371/25 |
| 5,084,874 | 1/1992 | Whetsel, Jr. | 371/22.3 |
| 5,208,813 | 5/1993 | Stallmo | 371/10.1 |
| 5,220,281 | 6/1993 | Matsuki | 324/158 R |
| 5,260,947 | 11/1993 | Posse | 371/22.3 |
| 5,260,950 | 11/1993 | Simpson et al. | 371/22.3 |
| 5,281,864 | 1/1994 | Hahn et al. | 307/272.2 |
| 5,285,152 | 2/1994 | Hunter | 324/158 R |
| 5,313,469 | 5/1994 | Adham et al. | 371/22.1 |
| 5,319,646 | 6/1994 | Simpson et al. | 371/22.3 |
| 5,321,277 | 6/1994 | Sparks et al. | 257/48 |
| 5,341,381 | 8/1994 | Fuller | 371/10.1 |

OTHER PUBLICATIONS

J. Rajski et al., "Recursive Pseudo exhaustive Test Pattern Generation", IEEE Transactions on Computers, vol. 42, No. 12, Dec. 1993, pp. 1517-1521.

E. M. Rudnick et al., "An Observability Enhancement Approach for Improved Testability and AT-Speed Test", IEEE Transactions on CAD of Integrated Circuits and Systems, vol. 13, No. 8, Aug. 1994.

*Primary Examiner*—Emanuel T. Voeltz
*Assistant Examiner*—Alan Tran
*Attorney, Agent, or Firm*—Willian Brinks Hofer Gilson & Lione

[57] ABSTRACT

The invention discloses a boundary scan cell circuit for use in checking a wire, establishing a connection between the output pin of one IC and the input pin of the other IC, for stuck-at "0"/"1" faults. In an input boundary scan cell circuit in connection with the input pin, a third selector, in response to a control signal, selects one of a signal from a logic signal input terminal and an XOR from an arithmetic unit thereby outputting a signal thus selected. The output of the third selector is latched by a first flip-flop. The arithmetic unit performs the XOR addition of the output of the first flip-flop and the value of a logic signal from the logic signal input terminal. The result of the XOR addition is scanned-out at a scan signal output terminal. This reduces the number of shift operation cycles required for scan-out of the test result thereby shortening the time taken for testing. In an output boundary scan cell circuit, test data is automatically logic-inverted, so that no shift operation cycles necessary for scan-in of inverted test data are required. Therefore, this reduces the time taken for testing.

14 Claims, 14 Drawing Sheets

| | Sca | Scb | Scc | Scd | Sce |
|---|---|---|---|---|---|
| Capture-DR | 0 | 0 | 1 | 1 | 0 |
| Capture-DR | 0 | 1 | 1 | 1 | 0 |
| Shift-DR | 1 | 0 | 1 | 1 | 0 |
| Update-DR | 0 | 1 | 1 | 0 | 1 |

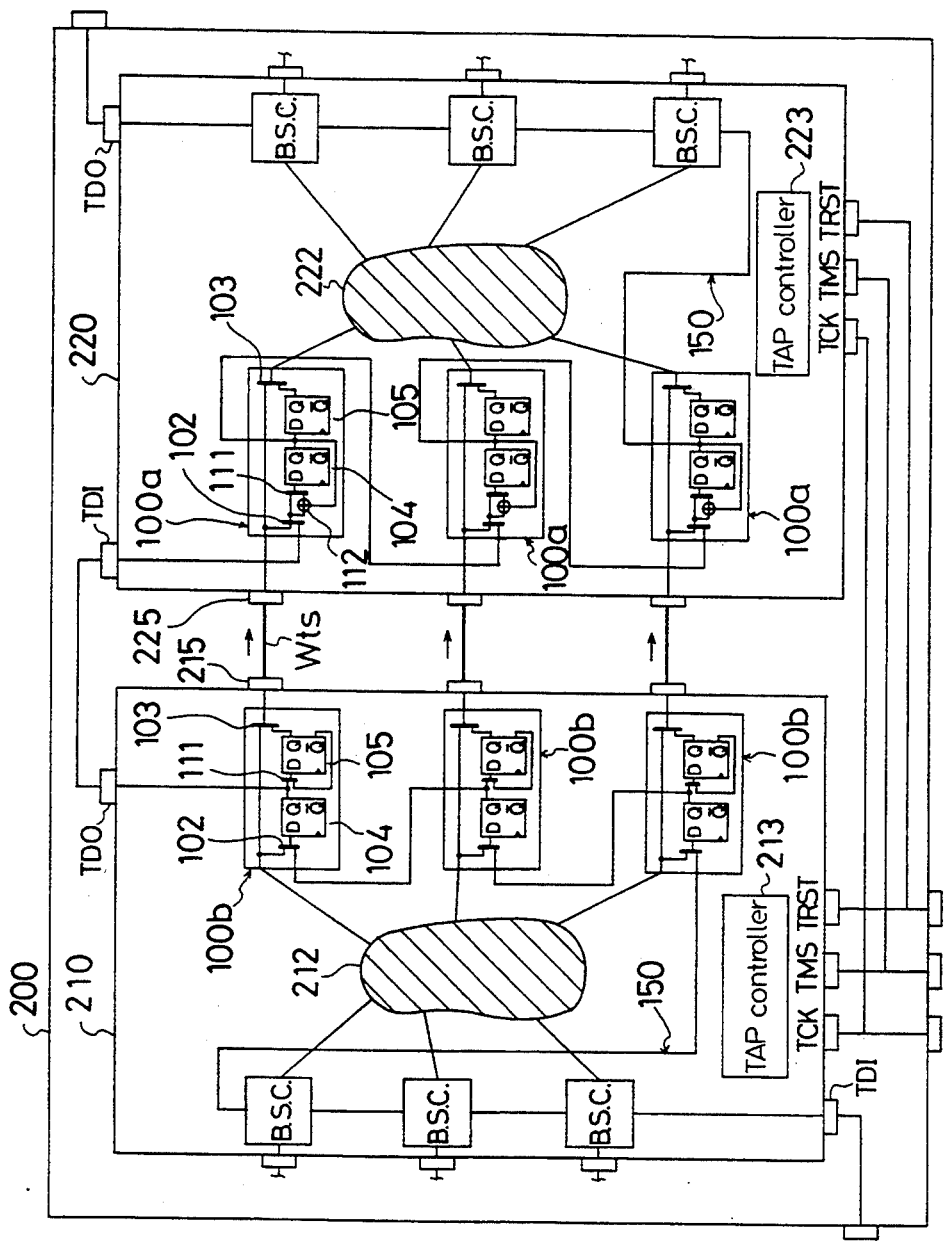

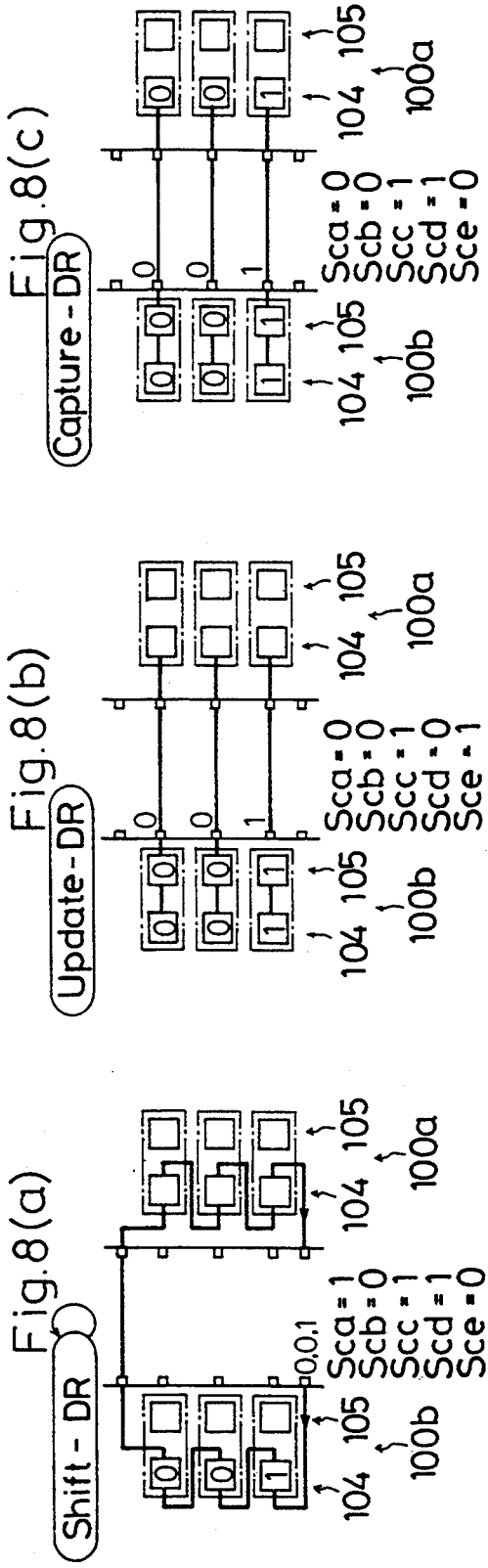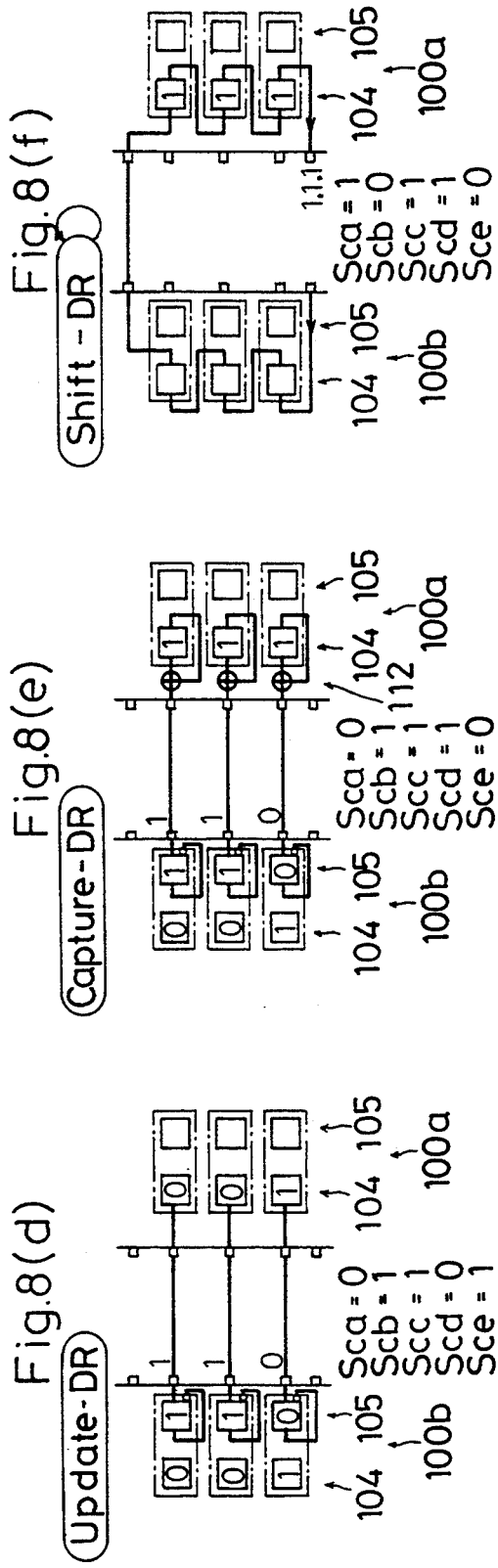

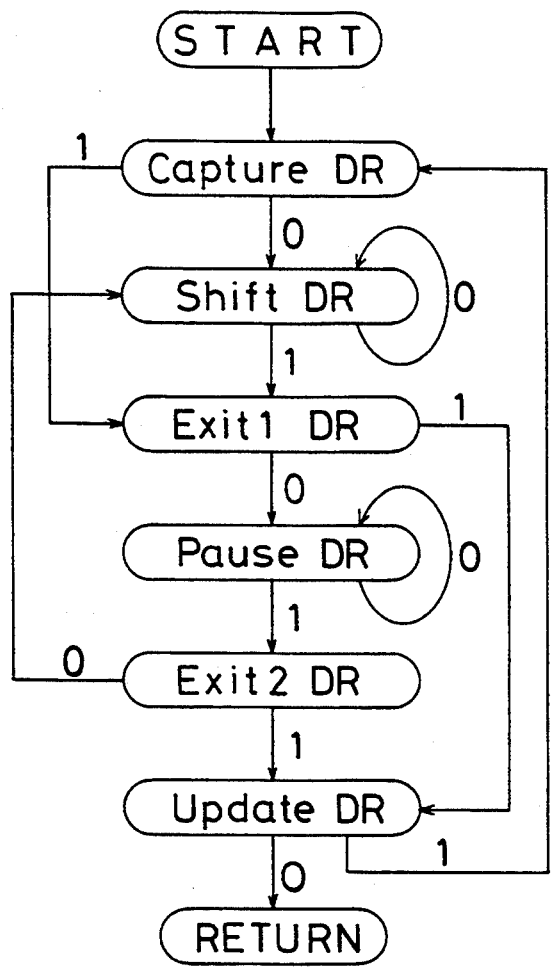

BOUNDARY SCAN CELL CIRCUIT AND BOUNDARY SCAN TEST CIRCUIT

BACKGROUND OF THE INVENTION

This invention pertains to boundary scan cell circuits (BSCC) provided in a corresponding manner to I/O pins of an integrated circuit (IC), to boundary scan test circuits (BSTC) for use in checking an inter-IC wiring subjected to testing for connection failures, and to a boundary scan testing.

Boundary scan testing has been developed as an attractive solution to problems accompanied with in-board wiring test techniques for checking, for example, printed circuit boards for the presence or absence of connection faulty. The accessing method as to boundary scan testing is standardized by IEEE1149.1. By referring to FIGS. 13–16, a BSCC structure conforming to IEEE1149.1 as well as a boundary scan test circuit structure for use in checking wire interconnection condition between on-board components by the use of an IEEE1149.1 BSCC is described.

FIG. 13 illustrates the organization of a boundary scan test circuit 200 employing a plurality of BSCCs. Provided on a printed circuit board are a plurality of ICs 210, 220, 230, and so on. The IC 210 (220, 230) comprises the following main components: a TAP controller (not shown in the figure) for controlling the operation of BSTC in-IC units; a plurality of connection terminals 215 (225, 235) for signal transfer between the ICs; and a plurality of BSCCs 100 (100, 100) the number of which is equal to the number of the connection terminals 215 (225, 235), each BSCC 100 being provided between an internal logic 212 (222, 232) and each connection terminal 215. In FIG. 13, connected between each connection terminal 215 and each connection terminal 225, between each connection terminal 225 and each connection terminal 235, between each connection terminal 235 and each connection terminal 215 are target wires $W_{ts}$ which are signal lines subjected to testing. As a result of such arrangement, a particular wire $W_{ts}$ is checked for connection failures such as disconnection according to the signal state. All of the BSCCs 100 are connected with one another in series, and a scan path 150 is provided in such a way that a scan signal $S_{scan}$ can pass through every IC. When checking $W_{ts}$ for stuck-at faults, a test logic signal (i.e. test data) is applied to a BSCC 100 through the scan path 150, which is hereinafter termed as "scan-in", whereas a logic signal (i.e. a result of the test) that has entered a BSCC 100 over $W_{ts}$ is output through the scan path 150, which is hereinafter termed as "scan-out". FIG. 13 shows various terminals. TDO is a scan signal output terminal at which $S_{scan}$ signal from the IC 220 is output. TDI is a scan signal input terminal at which $S_{scan}$ signal is input. TCK is a clock signal input terminal at which a clock signal is input. TMS is a test mode selection signal input terminal at which a test mode selection signal is input. TRST is a reset signal input terminal at which a reset signal is input.

By making reference to FIG. 14, the organization of the conventional BSCC 100 conforming to IEEE1149.1 is described. As shown in FIG. 14, the BSCC 100 comprises a first selector 102 which accepts two different input signals thereby outputting one of these two input signals according to a control signal $S_{ca}$, a second selector 103 which also accepts two different input signals thereby outputting one of these two input signals according to a control signal $S_{cc}$, a first flip-flop 104 which operates in synchronism with a clock signal $S_{cd}$, a second flip-flop 105 which also operates in synchronism with a clock signal $S_{ce}$, and a buffer 107 which gives a logic "1" output or a logic "0" output, these two logic outputs having the same drive power. In addition to the foregoing components, the BSCC 100 has a logic signal input terminal 101 at which a logic signal enters the BSCC 100, a scan signal input terminal 106 at which $S_{scan}$ scan signal from the scan path 150 enters the BSCC 100, control terminals 110a, 110c, 110d, and 110e at which $S_{ca}$ control signal, $S_{cc}$ control signal, $S_{cd}$ clock signal, and $S_{ce}$ clock signal are respectively input to the BSCC 100, a scan signal output terminal 108 at which $S_{scan}$ scan signal is sent out down to the scan path 150, and a logic signal output terminal 109 at which a logic signal leaves the BSCC 100.

Of the two input signals to the first selector 102, one is a logic signal $S_{lg}$ from the logic signal input terminal 101 and the other is $S_{scan}$ signal from the scan signal scan input terminal 106. The first selector 102 gives its output to the first flip-flop 104. The first flip-flop 104 outputs to the second flip-flop 105. Of the two input signals to the second selector 103, one is $S_{lg}$ logic signal from the logic signal input terminal 101 and the other is the output of the second flip-flop 105. The second selector 103 gives its output to the buffer 107. The output of the buffer 107 is applied to the logic signal output terminal 109 at which it leaves the BSCC 100. The BSCC 100 may be provided on the input side or on the output side, however, the basic structure of the BSCC 100 will not change with respect to the layout location.

FIG. 15 shows an interconnection of a BSCC 100 of the IC 210 serving as an output BSCC with a BSCC 100 of the IC 220 serving as an input BSCC. In the IC 210, the logic signal input terminal 101 is connected to the internal logic 212 and the logic signal output terminal 109 is connected to the connection terminal 215 which is an output pin. In the IC 220, on the other hand, the logic signal input terminal 101 is connected to the connection terminal 225 that is an input pin and the logic signal output terminal 109 is connected to the internal logic 222.

If the first selector 102 of the BSCC 100 in the first IC 210 selects $S_{scan}$ scan signal according to the logic state of $S_{ca}$ control signal, this serially connects all the first flip-flops 104 within the first IC 210. $S_{scan}$ scan signal is output at the TDO terminal. Thereafter, $S_{scan}$ scan signal is sequentially applied to the IC 210, to the IC 220, and so on through their respective scan signal input terminals 106, and is output at their respective scan output terminals 108.

How the boundary scan test circuit 200 checks $W_{ts}$ for stuck-at "0" faults is explained.

A logic value of "1" is pre-stored, by issuing a SAMPLE/PRELOAD instruction, in the second flip-flop 105 of the BSCC 100 of the IC 210. Then, an EXTEST instruction is executed. This changes the logic value of $S_{cc}$ control signal to a logic "1" and a "1" is output at the connection terminal 215. FIG. 16 is the state transition diagram of a TAP controller to IEEE1149.1. When the TAP controller is in the "Capture-DR" state, $S_{ca}$ control signal comes to have a logic value of "0", and a logic value (i.e. a result of the testing), passing through $W_{ts}$, is latched by the first flip-flop 104 of the input BSCC 100 of the IC 220. Next, when the TAP controller is in the "Shift-DR" state, $S_{ca}$ control signal comes to have a logic value of "1" and the scan path 150 enters the communication state while at the same time that logic value latched by the first flip-flop 104 is scanned-out. Of all the serial data scanned-out, a logic value string (i.e. a result of the testing) is checked against the input test data "1" so as to check $W_{ts}$ for the presence or absence of stuck-at "0" faults. For the case of checking $W_{ts}$ for stuck-at "1" faults, the output BSCC 100 outputs a logic value of "0" and the input BSCC 100 scans-out a test result to the scan path 150.

To sum up, if a logic value received by the input BSCC 100 through $W_{ts}$ matches one provided by the output BSCC 100, this indicates that the connection state of $W_{ts}$ is good. If the input BSCC 100 receives a logic value of "0" although the output BSCC 100 provides a logic value of "1", this is indicative of the occurrence of stuck-at "0" faults. Conversely, if output of a logic value of "0" results in input of logic value of "1", this is indicative of the occurrence of stuck-at "1" faults.

In general, two different test data items are required to perform the above-described stuck-at "0"/"1" fault testing, namely one formed by a particular logic value string and the other formed by inverting that particular logic value string. More specifically, in the case of making an output BSCC provide test data items of "0", "0", "0", "1", ... onto a wire subjected to testing, it is necessary to apply test data items of "1", "1", "1", "0", ... to that output BSCC. Meanwhile, upon receiving a logic signal over the wire, an input BSCC must supply both a test result against the non-inverted test data and another test result against the inverted test data onto a scan path. Accordingly, if wires subjected to testing total to N, the number of shift operation cycles is 4N cycles when performing stuck-at "0"/"1" fault testing. This produces a problem that as the I/O pin count (i.e. the wire count) increases testing time dramatically increases.

U.S. Pat. No. 5,084,874 shows a BSCC that comprises an input logic, a multiplexer capable of selecting between signals, a first and a second flip-flop for latching a signal from the multiplexer for a predetermined length of time, wherein the multiplexer and these two flip-flops are connected in series and the inverted output of the second flip-flop is fed back to the multiplexer. In such a prior art BSCC, however, since signals to a logic signal output terminal are always provided via the multiplexer and two flip-flops, this requires capture cycles for outputting the inversion logic to a logic signal output terminal. For this reason, testing circuitry becomes complicated since the way of controlling multiplexers is different between an input BSCC and an output BSCC. Therefore, the prior art techniques have difficulties in reducing testing time.

SUMMARY OF THE INVENTION

Bearing in mind the above-described problems accompanied with the prior art techniques, the present invention was made. It is a first object of the present invention to reduce boundary scan testing time. More specifically, in an input BSCC, a current logic output (i.e. a current test result) is XORed with a previous logic output (i.e. a previous test result) so as to reduce the cycle count necessary for scan-out of the test result with given test data. It is a second object of the present invention to reduce boundary scan testing time by providing a means capable of inverting test data thereby saving cycles required for scan-in of test data.

In order to accomplish the first object, the present invention discloses a first BSCC. This BSCC comprises the following components:
 (a) a logic signal input terminal at which an external logic signal enters the boundary scan cell circuit;
 (b) a scan signal input terminal at which an external scan signal enters the boundary scan cell circuit;
 (c) a scan signal output terminal at which a scan signal leaves the boundary scan cell circuit;
 (d) an input logic signal storage which latches a logic signal from the logic signal input terminal for a predetermined length of time and outputs it;
 (e) an XOR generator which generates the XOR of a logic signal from the input logic signal storage with a delay of a predetermined length of time and a current logic signal from the logic signal input terminal; and
 (f) a scan selector which selects one of a scan signal from the scan signal input terminal and an XOR signal from the XOR generator according to the logic state of a control signal and outputs a signal thus selected to outside the boundary scan cell circuit through the scan signal output terminal.

As a result of such an arrangement, if a current logic signal from the logic signal input terminal and a previous logic signal have the same logic value, the XOR generator gives an XOR sum of "0". If they differ with each other in logic value, an XOR sum of "1" is generated by the XOR generator. Therefore, in a stuck-at "0"/"1" fault testing in which if a target wire suffers from no failures, a logic signal input terminal should be fed alternately non-inverted logic signals and inverted logic signals through the target wire, if the XOR generator produces an XOR sum of "1", this indicates that no interconnection failures are found, whereas if the XOR generator produces an XOR sum of "0", this indicates that interconnection failures are existent. Such an XOR sum is scanned-out at the scan signal output terminal. Therefore, when performing stuck-at "0"/"1" fault testing, scan-out of both a test result with initial test data and a test result with an inverted test data becomes unnecessary. In other words, it is possible to carry out stuck-at "0"/"1" fault testing by performing the XOR addition of these two test results and by scanning-out only a resulting XOR sum. Accordingly, if this type of BSCC is disposed on the side at which a test signal via a target wire is input, the number of cycles required for scan-out of the result of the test can be reduced.

Preferably, the first BSCC further includes:
 an input signal selector which selects one of a logic signal from the logic signal input terminal and a scan signal from the scan signal input terminal according to the logic state of a control signal and outputs a signal thus selected to the XOR generator;
wherein:
 (a) tile scan selector's input is connected to the input signal selector's output as well as to the XOR generator's output;
 (b) the input logic signal storage, formed by a flip-flop for holding an input logic signal whose input is connected to the scan selector's output and whose output is connected to the scan signal output terminal, outputs one of an input logic signal and an XOR signal according to the logic state of a clock signal; and
 (c) the scan signal output terminal is connected to a non-inverting output terminal of the flip-flop.

As a result of such an arrangement, when a logic signal from the logic signal input terminal is selected by the input signal selector, such a logic signal will be latched by the flip-flop for a predetermined length of time according to the logical value of a clock signal, thereafter being applied to the XOR generator at which it is compared with a new logic signal from the logic signal input terminal. In this way, an XOR sum, used for checking for wire stuck-at faults, is generated. Conversely, if a scan signal is selected by the input signal selector, such a scan signal, passing through the scan selector and through the flip-flop, is output at the scan signal output terminal. Input and output of a scan signal to and from a BSCC is timed by a clock signal for synchronization, whereby the wiring testing can be carried out smoothly.

In order to accomplish the second object, the present invention discloses a second BSCC. This BSCC comprises the following components:

(a) a logic signal output terminal at which a logic signal is output, (b) a scan signal input terminal at which an external scan signal enters the boundary scan cell circuit;

(c) a scan signal output terminal at which a scan signal leaves the boundary scan cell circuit;

(d) an input scan signal storage which latches a scan signal from the scan signal input terminal for a predetermined length of time and outputs it;

(e) an inversion signal generator which accepts the output of the input scan signal storage and inverts it to give an inverted scan signal;

(f) an input signal selector whose input is connected to the scan signal input terminal as well as to the inversion signal generator and whose output is connected to the input scan signal storage, the input signal selector alternately selecting an input scan signal from the scan signal input terminal and an inverted scan signal from the inversion signal generator according to the logic state of a control signal and outputting a signal thus selected; and (g) an alternate signal output unit which latches a signal selected by the input signal selector for a predetermined length of time and outputs it to outside the boundary scan cell circuit through the logic signal output terminal;

wherein the scan signal output terminal is connected to a signal line between the scan signal input terminal and the input signal selector.

As a result of such an arrangement, the input signal selector alternately selects input scan signals and their inversions. Then, these two other signals leave the BSCC one after the other under control of the alternate signal output unit. If such a BSCC is disposed on the side at which test data being supplied to a target wire is output and a certain test data item is applied to the BSCC via the scan signal input terminal, this automatically produces the inverted logic value of that test data item within the BSCC. Then, test data items and their logic inversions are alternately provided at the logic signal output terminal and applied to the wire. This saves cycles necessary for scanin of the inversion logic value of test data.

Although the output of the inversion signal generator is fed back to the input signal selector, the output to the scan path will not interfere with the inversion signal because the scan signal output terminal is connected to a signal line between the input signal selector and the scan signal input terminal. Once test data is input, it is maintained for reuse. Therefore, the number of shift operation cycles required for scan-out of test data can be reduced, thereby reducing the time taken for providing test data and its inversion logic value.

Preferably, in the second BSCC:

(a) the input scan signal storage, inversion signal generator, and alternate signal output unit are formed by a single flip-flop for holding an input scan signal having a non-inverting output terminal and an inverting output terminal, the flip-flop being capable of outputting the non-inverted signal of an input signal through the non-inverting output terminal or the inverted signal of an input signal through the inverting output terminal according to the logic state of a clock signal;

(b) the logic signal output terminal is connected to the non-inverting output terminal of the flip-flop; and (c) the input signal selector is a selector whose input is connected to the scan signal input terminal as well as to the inverting output terminal of the flip-flop and whose output is connected to an input terminal of the flip-flop.

As a result of such an arrangement, a single flip-flop concurrently serves as an input scan signal storage, as an inversion signal generator, and as an alternate signal output unit. Therefore, with such a simplified structure, the production of the inversion logic value of test data and the alternate output of test data and its inversion logic value become possible.

Further, a single BSCC may have both the first BSCC's configuration and the second BSCC's configuration. As a result, such a BSCC comes to have advantages of both the first and second BSCCs.

If every BSCC has both the first BSCC's configuration and the second BSCC's configuration, this lowers production costs by changing the function of the BSCCs with respect to their layout location.

The present invention discloses a boundary scan test circuit which comprises the following components:

(a) a plurality of integrated circuits each of which has an internal logic, an input pin at which an external logic signal enters the internal logic, and an output pin at which a logic signal leaves the internal logic;

(b) a wire mount, disposed between the input pin of any one of the plurality of integrated circuits and the output pin of the other integrated circuit, onto which a wire, subjected to interconnection testing, is mounted;

(c) input boundary scan cell circuits each disposed between the input pin of each of the plurality of integrated circuits and the internal logic of each of the plurality of integrated circuits;

(d) output boundary scan cell circuits each disposed between the output pin of each of the plurality of integrated circuits and the internal logic of each of the plurality of integrated circuits; and (e) a scan path for connecting the boundary scan cell circuits in series.

This boundary scan test circuit employs the above-described first BSCCs as input BSCCs.

As a result of such an arrangement, when performing stuck-at "0"/"1" fault testing with a target wire subjected to testing, the number of cycles necessary for scan-out of the result of the test through the scan path can be reduced. In other words, if the number of target wires=N, the number of cycles for scanning-out the result of the test can be reduced down to N cycles.

Additionally, the present invention discloses a modification of the above-described boundary scan test circuit in which, as output BSCCs, the above-described second BSCCs are employed.

As a result of such an arrangement, cycles for scan-in of the inversion logic value of a test data item to an output BSCC become unnecessary. In other words, if the number of target wires=N, the number of cycles necessary for scan-in of test data can be reduced down to N cycles.

Conventionally, 4N cycles are required for shift operation, however, the present invention reduces it down to 2N cycles.

BRIEF DESCRIPTION OF THE DRAWINGS

In the drawings:

FIG. 7 is a circuit diagram of a BSCC of a third preferred embodiment of the present invention;

FIGS. 8a, 8b, 8c, 8d, 8e, and 8f are diagrams showing changes in control signal, the flow of test data, and the flow of test results during each control mode, in a stuck-at "0"/"1" fault testing by the use of BSCCs of the third preferred embodiment;

FIG. 16 is a state transition diagram showing changes in control mode in a conventional stuck-at "0"/"1" fault testing.

DETAILED DESCRIPTION OF THE INVENTION

By making reference to the accompanying drawings, preferred embodiments of the present invention are now described below.

Example 1

Figure 13:
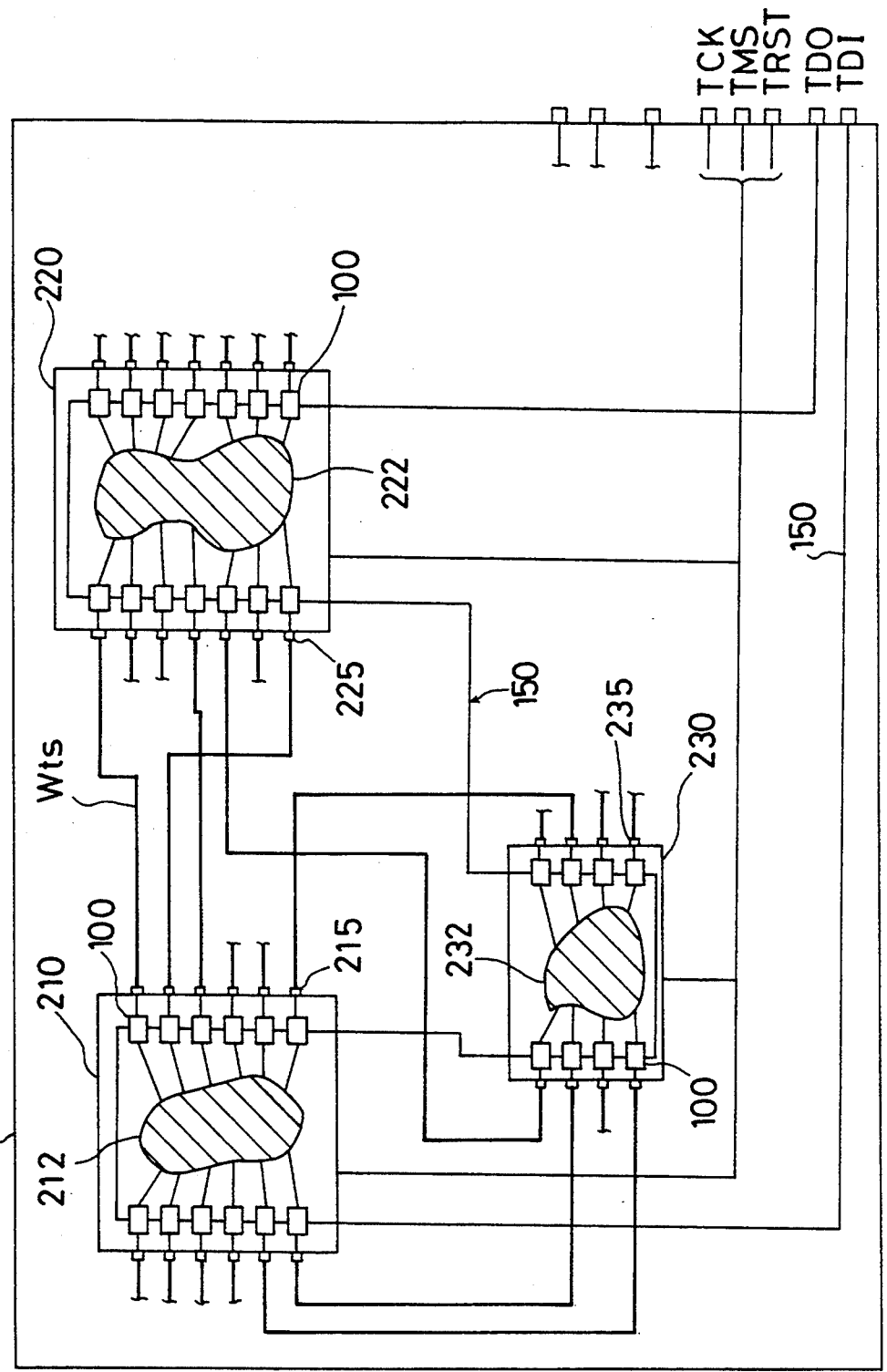
FIG. 13 is a block diagram of a conventional boundary scan test circuit.

A first preferred embodiment is explained by reference to FIGS. 1-3. It is to be noted that the layout of components within a boundary scan test circuit of the present invention is basically identical with that of the conventional boundary scan test circuit as shown in FIG. 13 except for the organization of BSCCs.

Figures 1, 2:
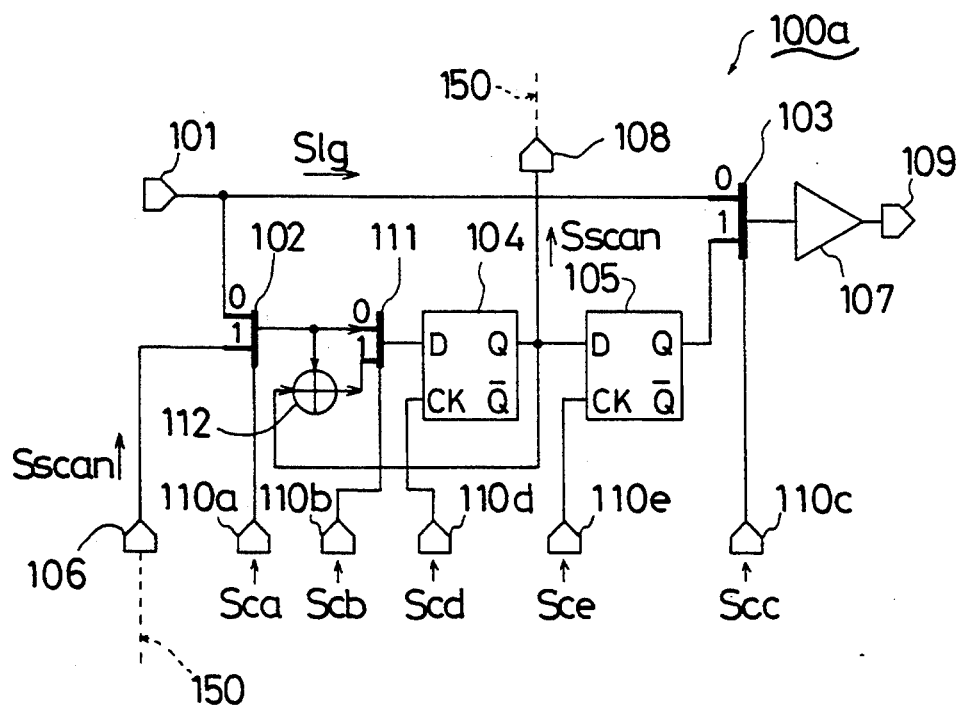
FIG. 1 is a circuit diagram of a BSCC of a first preferred embodiment of the present invention.
FIG. 2 is a state transition diagram showing changes in control state and changes in control signal during each control mode, in a stuck-at "0"/"1" fault testing by the use of BSCCs of the first preferred embodiment.
Figure 14:
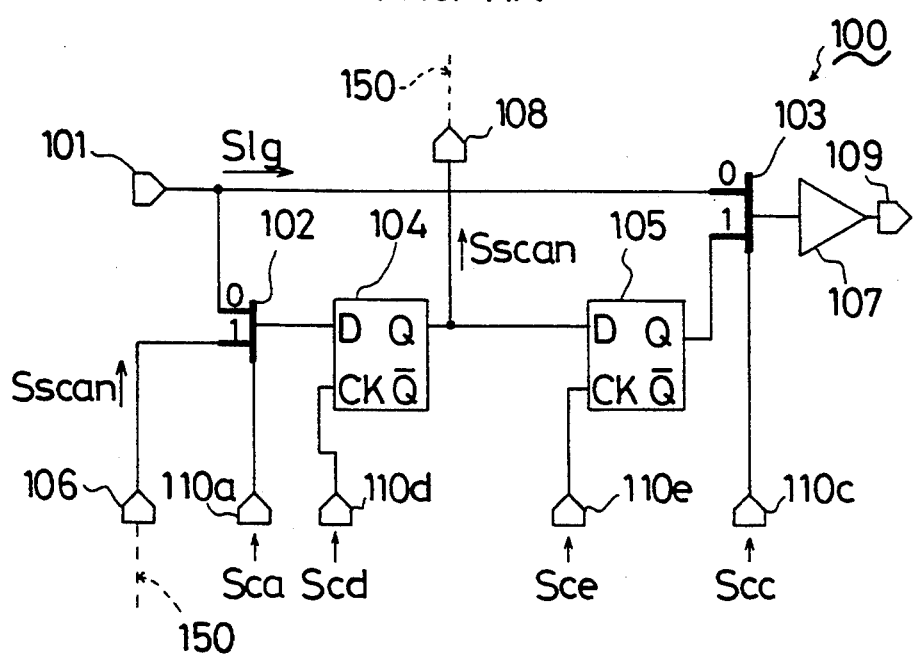
FIG. 14 is a circuit diagram of a conventional BSCC.
Figure 15:
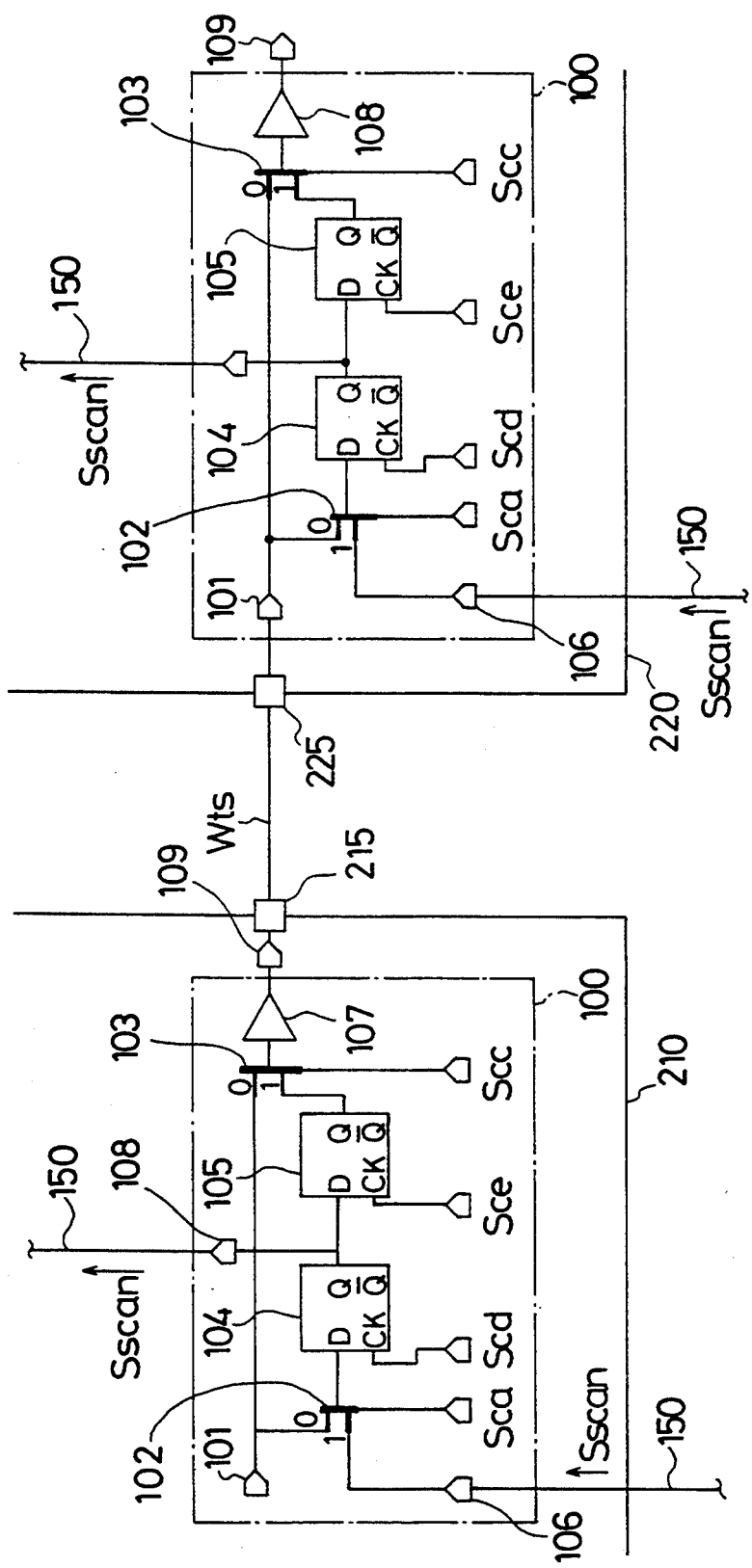
FIG. 15 shows a connection relationship between conventional output input BSCCs.

FIG. 1 shows one BSCC 100a in accordance with the present embodiment. Like the BSCC 100 of FIG. 14, this BSCC 100a comprises the following components: a first selector 102, a second selector 103, a first flip-flop 104, a second flip-flop 105, a buffer 107, a logic signal input terminal 101, a scan signal input terminal 106, a scan signal output terminal 108, a logic signal output terminal 109, and five control signal terminals 110a–110e.

The present embodiment is characterized in that there are provided, between the first selector 102 and the first flip-flop 104, a third selector 111 that serves as a scan signal selector as well as an arithmetic unit 112 that serves as an XOR generator. The arithmetic unit 112 accepts the non-inverted output signal of the first flip-flop 104 serving as an input logic signal storage and the output signal of the first selector 102. The third selector 111 accepts the output signal of the first selector 102 and the output signal of the arithmetic unit 112, thereby selecting one of these two signals according to the logic state of a control signal $S_{cb}$ which is input at the terminal 110b and outputting a signal thus selected. The first flip-flop 104 accepts the output signal of the third selector 111 at its terminal D, and latches it according to the logic state of a clock signal $S_{cd}$ which is input at a terminal CK, and outputs it at its terminal Q. The arithmetic unit 112 accepts the output signal of the first selector 102 as well as the non-inverted output signal of the first flip-flop 104 thereby outputting an XOR sum of these two signals. The second flip-flop 105 accepts the non-inverted output signal of the first flip-flop 104 at its terminal D. According to the logic state of a clock signal $S_{ce}$ which is input at its terminal CK, the second flip-flop 105 latches that signal from the first flip-flop 104 and outputs same at its terminal Q. The second selector 103 is fed the non-inverted output signal of the second flip-flop 105 and a logic signal $S_{lg}$ from the logic signal input terminal 101. Then, according to the logic state of a control signal $S_{cc}$, the second selector 103 selects one of such two signals and outputs a signal thus selected. The second selector 103 gives its output to the buffer 107. Such an output signal of the second selector 103 is delivered to outside the BSCC 100a (for example, to an internal logic) through the logic signal output terminal 109. The scan signal output terminal 108 is connected to the first flip-flop's 104 non-inverting terminal Q. The output of the arithmetic unit 112 is scanned-out to the scan path 150, through the scan signal output terminal 108.

In FIG. 1, the first to third selectors 102, 103, 111 are assigned "0" and "1" at their respective inputs. For example, if the first selector 102 receives $S_{ca}$ control signal carrying thereon a logic value of "0", it selects $S_{lg}$ logic signal from the logic signal input terminal 101 as its input. On the other hand, if it receives $S_{ca}$ control signal carrying thereon a logic value of "1", it selects $S_{scan}$ scan signal from the scan signal input terminal 106 as its input.

Figure 3A:
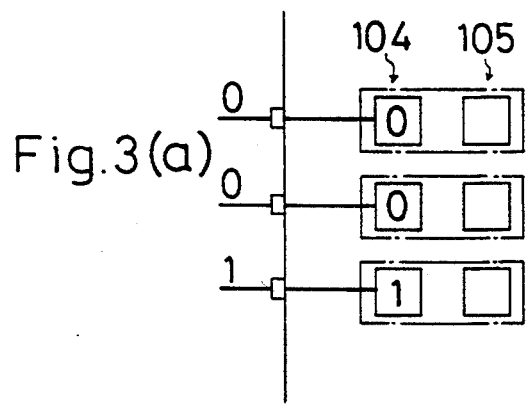
FIGS. 3a, 3b, 3c are diagrams respectively showing the flows of test results in the first "Capture-DR" state, in the second "Capture-DR" state, and in the "Shift-DR" state in a stuck-at "0"/"1" fault testing by the use of BSCCs of the first preferred embodiment.
Figure 3B:
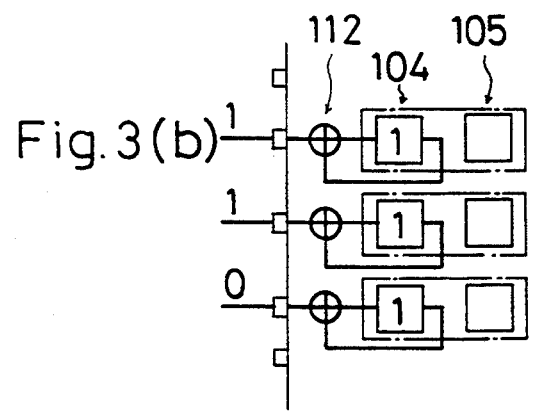
Figure 3C:
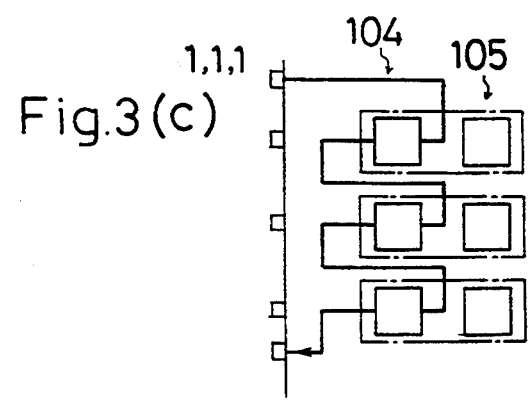

FIGS. 2 and 3a–3c describe how the above-described BSCC 100a operates. Of these figures, FIG. 2 is a TAP controller state transition diagram. FIGS. 3a, 3b, 3c describe how three different BSCCs 100a, arranged on the IC input pins' side, operate.

As shown in FIG. 2, in the first "Capture-DR" state, both $S_{ca}$ and $S_{cb}$ control signals are logic "0's", so that $S_{lg}$ logic signal from the logic signal input terminal 101 is latched by the first flip-flop 104 on the leading edge of $S_{cd}$ clock signal. At this point in time, $S_{cc}$ control signal is a logic "1" and $S_{ce}$ clock signal is a logic "0".

In the second "Capture-Dr" state, $S_{cb}$ control signal changes its logic value from "0" to "1" and thereafter $S_{cd}$ clock signal is applied. As shown in FIG. 3b, a logic value pre-latched by the first flip-flop 104 is XORed with a value of current $S_{lg}$ logic signal from the logic signal input terminal 101, thereafter a newly obtained XOR being latched by the first flip-flop 104. If a value of $S_{lg}$ logic signal latched in the first "Capture-DR" state and a value of $S_{lg}$ logic signal latched in the second "Capture-DR" state are in a logic inversion relationship with each other, the logic value of "1" is always latched by the first flip-flop 104. For example, if these three BSCCs 100a receive three $S_{lg}$ logic signals carrying logic values of "0", "0", and "1", respectively in the first "Capture-DR" state (see FIG. 3a) and if they receive three $S_{lg}$ logic signals carrying logic values of "1", "1", and "0", respectively in the second "Capture-DR" state (see FIG. 3b), this causes each first flip-flop 104 to latch an XOR of "1".

Next, in the "Shift-DR" state, $S_{ca}$ control signal becomes logic "1". Upon receipt of $S_{scan}$ scan signal, the first flip-flop 104 starts functioning as a shift register. In this state, the first flip-flop 104 provides its lastly latched logic value as $S_{scan}$ scan signal (see FIG. 3c).

The application of $S_{ce}$ clock signal in the "Update-DR" state of FIG. 2 causes the second flip-flop 105 to latch the output of the first flip-flop 104. Further, by changing the logic value of $S_{cc}$ control signal to logic "1", this enables the buffer 107 to output the non-inverted output of the second flip-flop 105, regardless of the value of $S_{lg}$ logic signal from the logic signal input terminal 101.

In accordance with the BSCC 100a of the present embodiment, if logic values latched in the first and second "Capture-DR" states match with each other, the first flip-flop 104 latches a logic "0". If they disagree with each other, the first flip-flop 104 latches a logic "1". The present embodiment is able to reduce the number of shift operation cycles necessary for scan-out in boundary scan cell circuits in which continuously logic-inverted signals are lathed. For example, when checking inter-IC wiring for stuck-at "0"/"1" faults, a wire subjected to testing is fed test data and its inversion logic signal, in a BSCC arranged on the input side of an IC. Scanning-out these two different input signals through the wire becomes unnecessary. The presence or absence of stuck-at "0"/"1" faults can be probed by scanning-out only an XOR signal. This reduces the number of shift operation cycles necessary for scan-out, thereby shortening testing time. If the number of wires subjected to testing=N, the number of shift operation cycles required for completing scan-out of the result of the test=N. Accordingly, as the packaging density of ICs increases, boundary scan cell test circuits using the BSCC 100a of the present embodiment become more beneficial. That is, in accordance with the present embodiment, the number of shift operation cycles required can be reduced substantially compared to the prior techniques.

Additionally, the above-described arrangement allows the buffer 107 to provide any logic value. Further, output of a 1-bit XOR as a result of XORing a firstly latched logic value with a secondly latched logic value becomes possible.

It is to be noted that the present invention is not limited to the organization of the BSCC 100a of FIG. 1. For example, the provision of the second flip-flop 105 may be omitted. That the first selector 102 selects one of $S_{scan}$ scan signal and $S_{lg}$ logic signal and applies $S_{scan}$ scan signal or $S_{lg}$ logic signal, whichever is selected, to the arithmetic unit 112 is not a requirement. Input of only $S_{lg}$ logic signal to the first flip-flop 104 may be sufficient, in which case it is possible to route $S_{scan}$ scan signal through a different path to the scan signal output terminal 108 at which it ($S_{scan}$) is output. In the present embodiment, the first flip-flop 104 serving as a temporary storage for input scan signals is employed, but other elements capable of temporarily holding information may be used. However, with the above-described simple circuitry of FIG. 1, it is possible to provide synchronization of input of $S_{lg}$ logic signal, scan-out of XOR signal, and output of $S_{scan}$ scan signal to another BSCC 100a.

Example 2

A BSCC 100b of a second preferred embodiment of the present invention is now described below by making reference to FIGS. 4, 5, and 6a to 6c.

Figure 4:
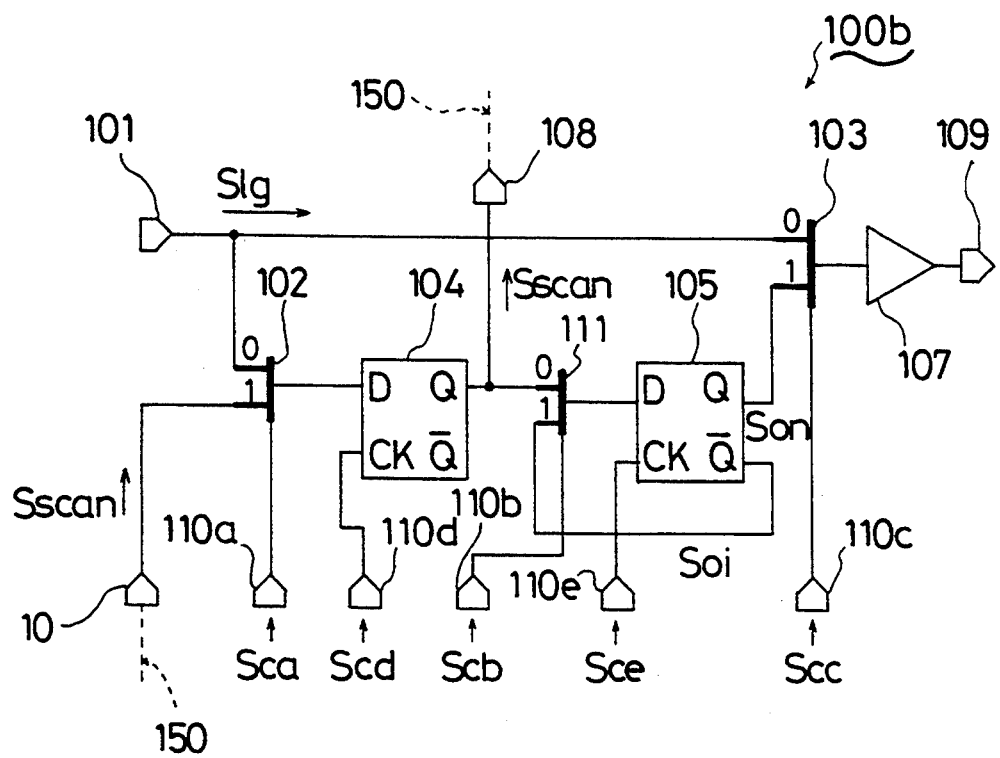
FIG. 4 is a circuit diagram of a BSCC of a second preferred embodiment of the present invention.

FIG. 4 shows the BSCC 100b. As shown in the figure, this BSCC 100b, like the BSCC 100a of the first embodiment, has the first selector 102, second selector 103, third selector 111, first flip-flop 104, second flip-flop 105, buffer 107, logic signal input terminal 101, scan signal input terminal 106, scan signal output terminal 108, logic signal output terminal 109, and control signal terminals 110a-e. In the present embodiment, however, the third selector 111 is provided between the first flip-flop 104 and the second flip-flop 105 and no OR generators are provided.

The first selector 102 receives $S_{lg}$ logical signal from the logic signal input terminal 101 and $S_{scan}$ scan signal from the scan signal input terminal 106, and selects one of these two input signals according to the logic state of $S_{ca}$ control signal, and outputs a selection (i.e. a signal thus selected). The first flip-flop 104 receives at its terminal D the output of the first selector 102 thereby holding and providing it under control of $S_{cd}$ control signal which is input at the first flip-flop's 104 terminal CK. The third selector 111 accepts the non-inverted output of the first flip-flop 104 and an inverted signal $S_{oi}$ of the second flip-flop 105, and selects one of them according to the logic state of $S_{cb}$ control signal, and outputs a signal thus selected. The second flip-flop 105 receives at its terminal D the output of the third selector 111 and holds it. The second selector 103 is fed a non-inverted signal $S_{on}$ from the second flip-flop 105 and $S_{lg}$ logical signal from the logic signal input terminal 101, and selects one of them according to the logic state of $S_{cc}$ control signal, and outputs a selection. The buffer 107 receives the output of the second selector 103, and outputs it through the logic signal output terminal 109 to outside the BSCC 100b (for example, to $W_{ts}$ of FIG. 13 which is a wire subjected to testing).

Figure 5:
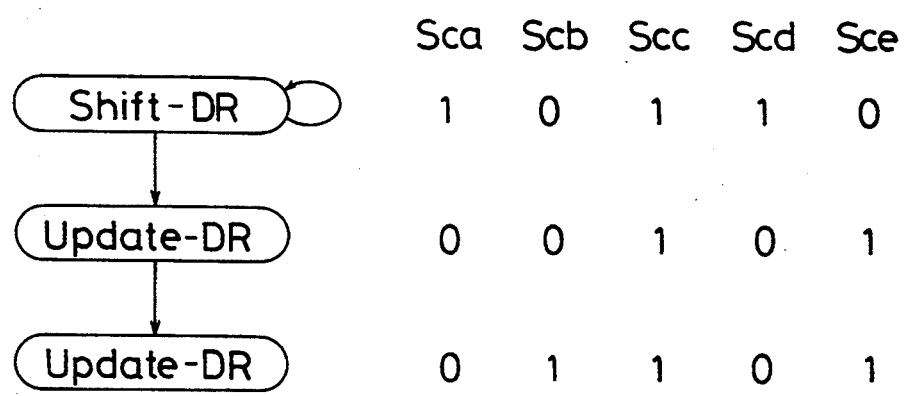
FIG. 5 is a state transition diagram showing changes in control state and changes in control signal during each control mode, in a stuck-at "0"/"1" fault testing by the use of BSCCs of the second preferred embodiment.
Figure 6A:
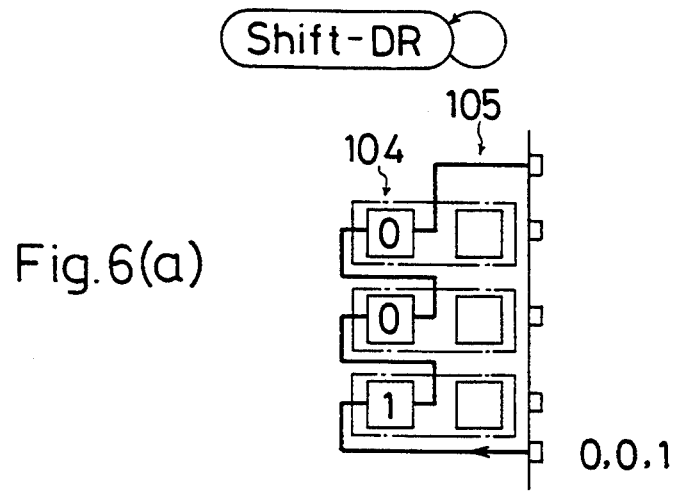
FIGS. 6a, 6b, and 6c are diagrams respectively showing the flows of test results in the "Shift-DR" state, in the first "Update-DR" state, and in the second "Update-DR" state in a stuck-at "0"/"1" fault testing by the use of BSCCs of the second preferred embodiment.
Figure 6B:
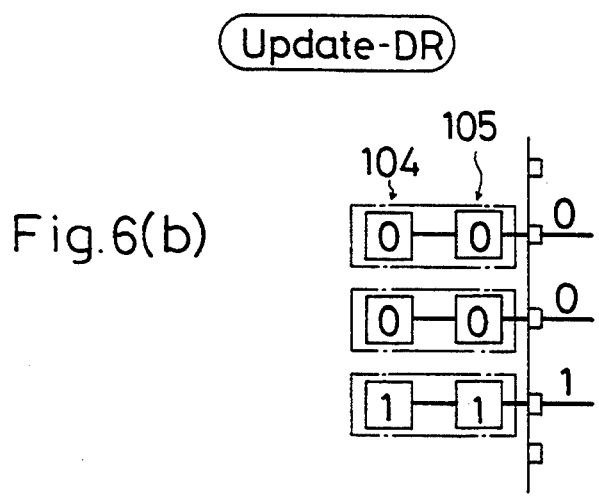
Figure 6C:
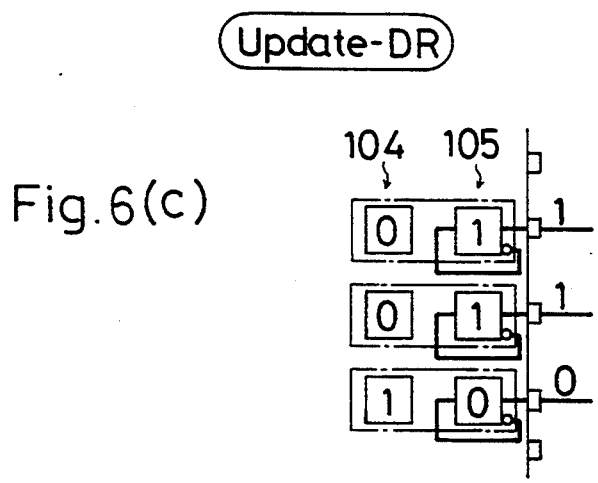

FIGS. 5 and 6a to 6c describe how the above-described BSCC 100b operates. Of these two figures, FIG. 5 is a state transition diagram. FIGS. 6a-6c describe how three different output BSCCs 100b operate.

In the "Shift-DR" state of FIG. 5, $S_{ca}$ control signal becomes logic "1" and, as shown in FIG. 6a, $S_{scan}$ scan signal is applied to the first flip-flop 104. The flip-flop 104 starts functioning as a shift register. Then, a certain logic value is supplied, as $S_{scan}$ scan signal, to each first flip-flop 104. For example, as shown in FIG. 6a, three logic values of "0", "0", and "1" are respectively latched by the three first flip-flops 104.

Next, in the first "Update-DR" state of FIG. 5, $S_{cb}$ control signal becomes logic "0", and, as shown in FIG. 6b, the logic values latched by the first flip-flops 104 are loaded into the corresponding second flip-flops 105. Then, $S_{cc}$ control signal becomes logic "1". This enables the buffer 107 to output the logic value previously applied as $S_{scan}$ scan signal, regardless of $S_{lg}$ logical signal from the logic signal input terminal 101. For instance, as shown in FIG. 6b, "0", "0", and "1" are respectively latched by the first flip-flops 104, and "0", "0", and "1" are respectively latched by the second flip-flops 105.

Next, in the second "Update-DR" state, $S_{cb}$ control signal becomes logic "1". If $S_{ce}$ clock signal is applied to the second flip-flop 105, the inversion value of the lastly latched logic value of the second flip-flop 105 is newly loaded thereinto and is output from the buffer 107. For example, if the three first flip-flops 104 latch "0", "0", and "1", respectively, the corresponding three second flip-flops 105 latch the inversion of what the first flip-flops 104 are latching, or "1", "1", and "0", respectively.

In accordance with the BSCC 100b of the second embodiment, the buffer 107 can immediately output the inversion of a logic value loaded in the first "Update-DR". This will reduce the number of scan-in shift operation cycles in a BSCC in which the buffer 107 outputs a signal which has undergone logic inversion twice in series. For example, when checking inter-IC wiring for stuck-at "0"/"1" faults, scan-in of the inversion of test data becomes unnecessary in a BSCC arranged at output of an IC. This considerably reduces testing time by an amount saved by eliminating the need for scan-in of the inversion of test data. In other words, if the number of wires subjected to testing=N, the number of shift operation cycles required for scan-in of the result of the test=N. Accordingly, as the packaging density of ICs increases, boundary scan cell test circuits by the use of the BSCC 100b of the present embodiment become more beneficial. That is, in accordance with the present embodiment, the number of shift operation cycles can be reduced substantially compared to the prior techniques.

Example 3

Referring now to FIGS. 7 and 8a-8f, a third preferred embodiment of the present invention is described, which pertains to a boundary scan test circuit.

FIG. 7 shows the organization of a boundary scan test circuit 200 in which the BSCCs 100a of the first embodiment are provided on the input side (thereafter, these BSCCs 100a are called the input BSCCs) and the BSCCs 100b of the second embodiment are provided on the output side (thereafter, these BSCCs 100b are called the output BSCCs). For convenience sake, only two ICs (i.e. the IC 210 and the IC 220), connection terminals (i.e. the connection terminals 215 and the connection terminals 225), and wires, subjected to testing (i.e. $W_{ts}$), between each connection terminal 215 and each connection terminal 225 are shown.

In FIG. 7, the connection terminal 215 serving as an output pin of the IC 210 is connected to the output BSCC 100b. The output BSCC 100b has the first selector 102, second selector 103, first flip-flop 104, second flip-flop 105, and third selector 111 which accepts the non-inverted output of the first flip-flop 104 as well as the inverted output of the second flip-flop 105, and selects one of them according to the logic state of a control signal, and outputs a selection. On the other hand, the connection terminal 225 serving as an input pin of the IC 220 is connected to the input BSCC 100a. The input BSCC 100a has the first selector 102, second selector 103, first flip-flop 104, second flip-flop 105, arithmetic unit 112 that accepts the output of the first selector 102 as well as the output of the first flip-Flop 104 thereby outputting the XOR of these two received outputs, and third selector 111 that accepts the output of the arithmetic unit 112 as well as the output of the first selector 102, selects one of them according to the logic state of a control signal, and outputs a selection. Although not shown in FIG. 7, the TAP controller 213 is connected by a signal wire to the input BSCC 100a and the TAP controller 223 is connected by a signal wire to the output BSCC 100b.

Referring now to FIGS. 8a-8f, both the operation of the input BSCC 100a and the operation of the output BSCC 100b are explained. In the "Shift-DR" state of FIG. 8a, three test data items, say, logic values of "0", "0", "1" are scanned-in to the first flip-flops 104 of the output BSCCs 100b through the scan path 150.

Next, in the "Update-DR" state of FIG. 8b, the test data items of "0", "0", "1" are transferred from the first flip-flops 104 to the second flip-flops 105, thereafter being applied to wires $W_{ts}$ subjected to testing.

In the "Capture-DR" state of FIG. 8c, the test data items of "0", "0", "1" propagate through the wires $W_{ts}$ to the first flip-flops 104 of the input BSCCs 100a and are latched.

Then, in the second "Update-DR" state of FIG. 8d, without newly scanning-in test data items to the second flip-flops 105 of the output BSCCs 100b, the inversion of the previous test data items, that is, "1", "1", "0" are applied to the wires $W_{ts}$ by means of feedback of $S_{oi}$ inverted signal to the input signal selector.

In the second "Capture-DR" state, the first flip-flops 104 of the BSCCs 100a latch the XORs of the previous test results (i.e. "0", "0", "1") and the current test results ("1", "1", "0"), respectively. If each $W_{ts}$ is free from stuck-at "0"/"1" faults, each first flip-flop 104 should latch a logic "1".

Further, in the second "Shift-DR" state of FIG. 8f, "1", "1", and "1" (XOR) latched by the first flip-flops 104 of the BSCCs 100a are scanned-out through the scan path 150. By comparing these XORs ("1", "1", "1") with expected values ("1", "1", "1"), it is possible to check $W_{ts}$ for the presence or absence of stuck-at "0"/"1" faults.

In the present embodiment, no shift operations for scanin of the inversion of test data are required within the output BSCC 100b when checking for stuck-at "0"/"1" faults. Additionally, scan-out of both a test result with test data and a test result with the inversion of that test data is unnecessary and thus only scan-out of the XOR of these two test results is required. This greatly reduces testing time. In other words, if the number of wires subjected to testing=N, the shift operation necessary for scanning-in test data and for scanning-out a test result is completed for 2N cycles. Therefore, the present embodiment greatly reduces the number of shift operation cycles compared to the prior techniques which require 4N cycles. This means that, as the packaging density of ICs increases, the present embodiment becomes more beneficial.

Example 4

A fourth preferred embodiment of the present invention is described, wherein two different BSCCs (i.e. the BSCC 100a and the BSCC 100b) are provided within a single IC 240.

Figure 9:
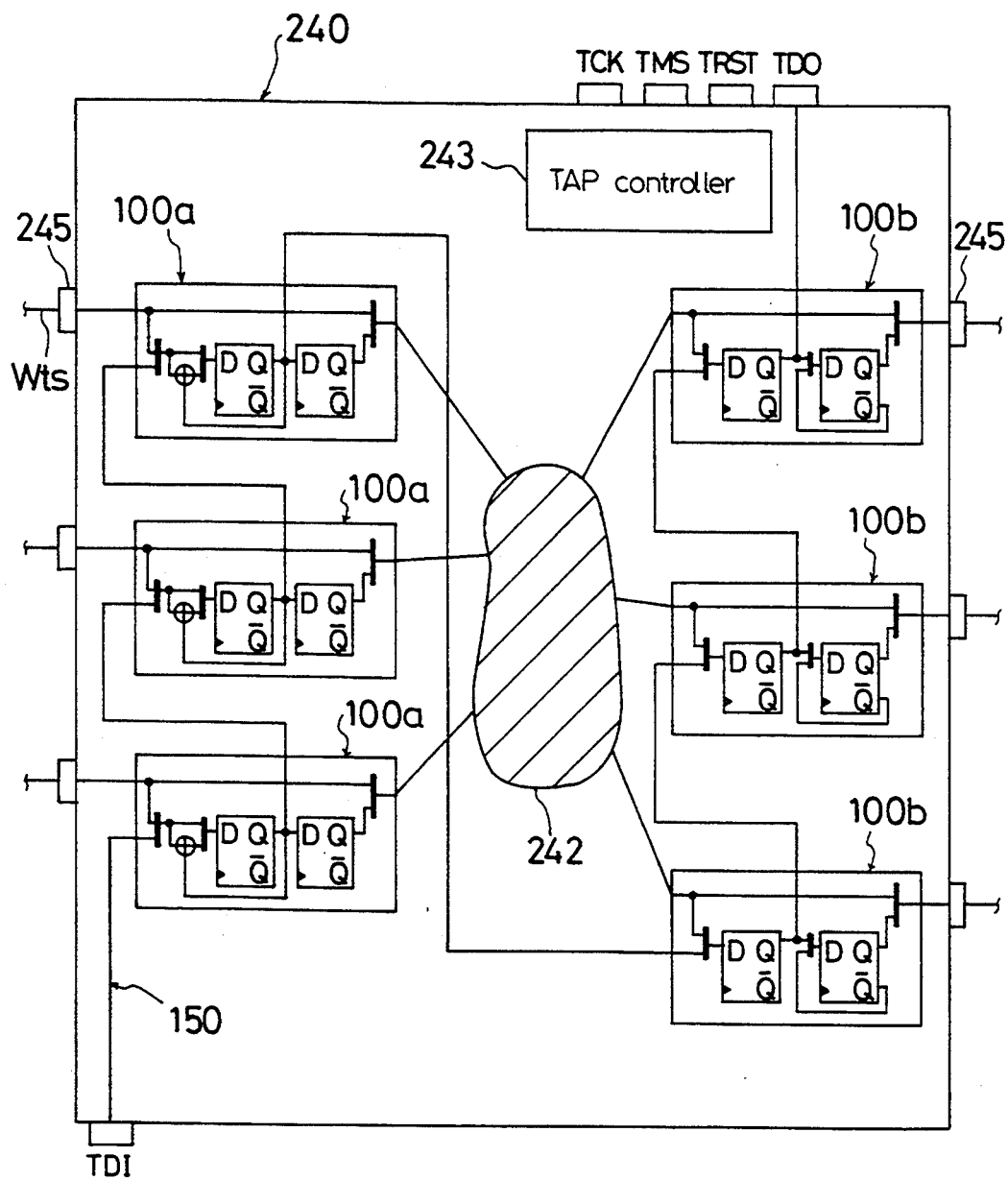
FIG. 9 is a circuit diagram of a BSCC of a fourth preferred embodiment of the present invention.

FIG. 9 is the organization of the IC 240. This IC 240 has an internal logic 242 and a TAP controller 243. The BSCC 100a of the first embodiment is disposed between a connection terminal 245 serving as an input pin and the internal logic 242, whereas the BSCC 100b of the second embodiment is disposed between a connection terminal 245 serving as an output pin and the internal logic 242.

In accordance with the present embodiment, the same effects as the third embodiment can be obtained within a single IC.

Example 5

Figure 10:
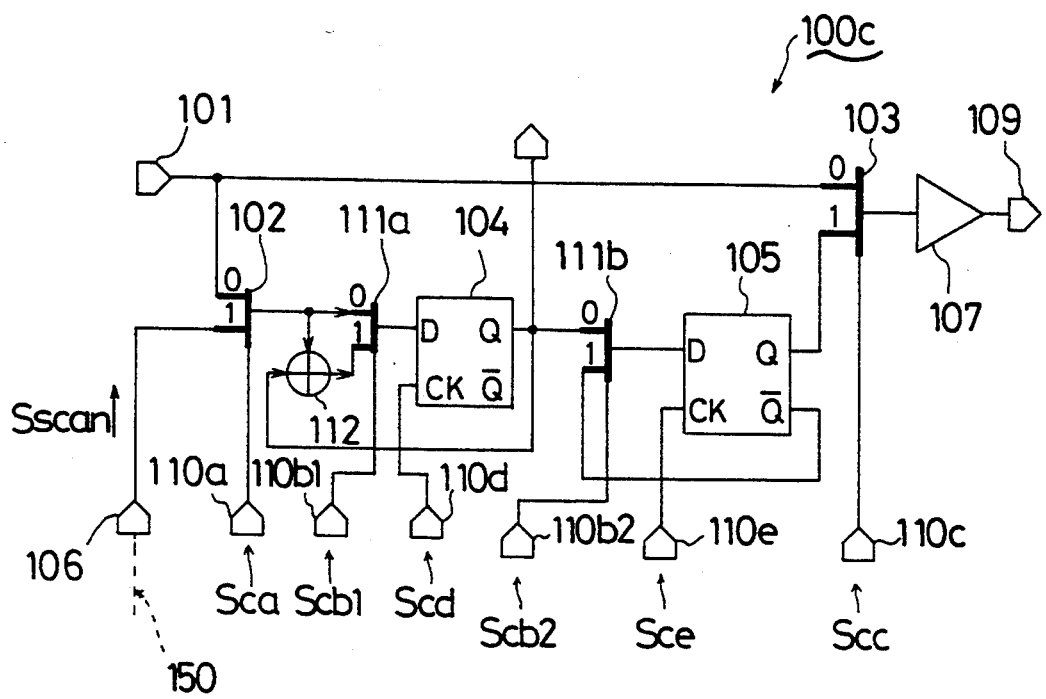
FIG. 10 is a circuit diagram of a BSCC of a fifth preferred embodiment of the present invention.
Figure 11:
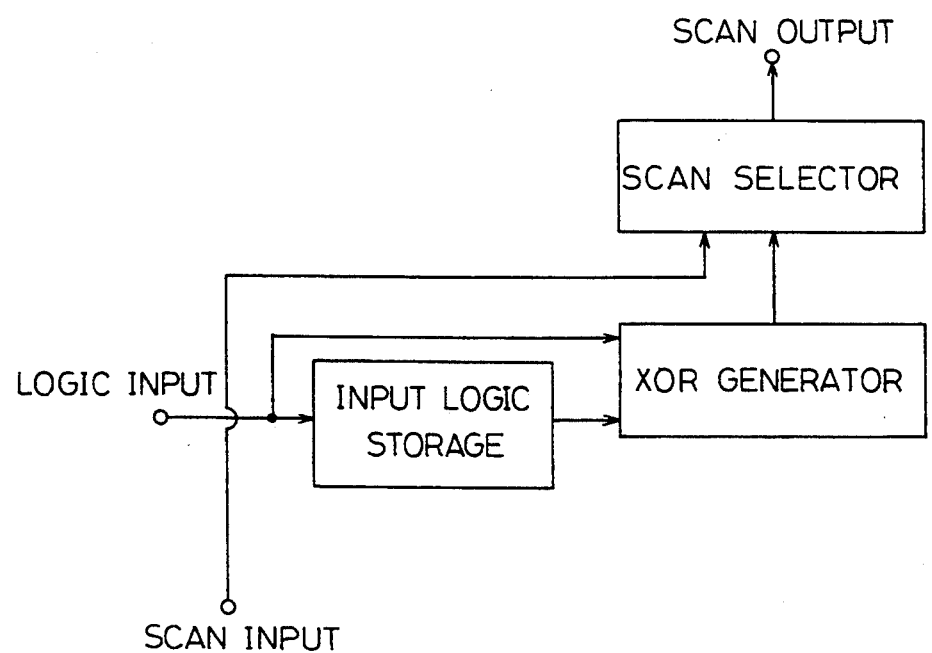
FIG. 11 is a block diagram of a first means.
Figure 12:
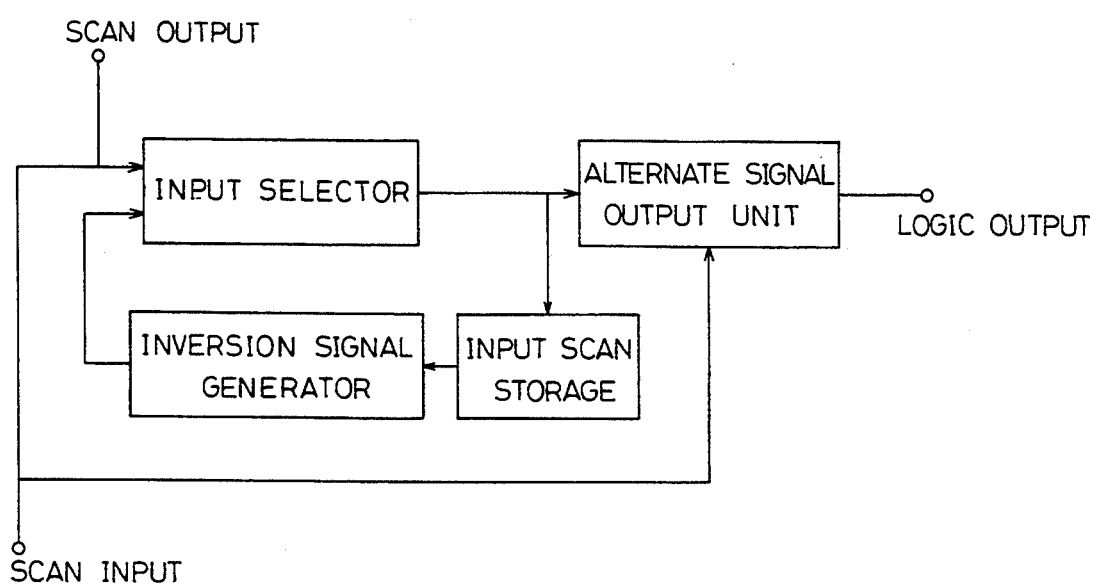
FIG. 12 is a block diagram of a second means.

Referring to FIG. 10, a fifth preferred embodiment of the present invention is explained. This embodiment pertains to a BSCC 100c of a dual function type.

The BSCC 100c, like the BSCC 100a of the first embodiment and the BSCC 100b of the second embodiment, has the logic signal input terminal 101, scan signal input terminal 106, scan signal output terminal 108, logic signal output terminal 109, first selector 102, second selector 103, buffer 107, first flip-flop 104 and second flip-flop 105. In the present embodiment, the BSCC 100c further includes the arithmetic unit 112 of the first embodiment serving as an XOR generator, a selector 111a which is a scan signal selector functioning in the same way as the third selector 111 of the first embodiment, and a selector 111b which is disposed between the first flip-flop 104 and the second flip-flop 105 as an input signal selector functioning in the same way as the third selector 111 of the second embodiment (see FIG. 4). The first selector 102 is fed $S_{ca}$ control signal from the terminal 110a. The selector 111a is fed a control signal $S_{cb1}$ from a terminal 110b1. The first flip-flop 104 is fed $S_{cd}$ clock signal from the terminal 110d. The selector 111b is fed a control signal $S_{cb2}$ from a terminal 110b2. The second flip-flop 105 is fed $S_{ce}$ clock signal from the terminal 110e. The second selector 103 is fed $S_{cc}$ control signal from the terminal 110c. If the BSCC 100c is connected to an IC's input pin, the logic state of $S_{cb2}$ control signal is fixed at logic "0" so that only the output of the first flip-flop 104 can pass through the selector 111b. The switching of $S_{cb1}$ control signal operates the selector 111a, whereby signals to be stored in the second flip-flop 105 and signals to be scanned-out are selected. If the BSCC 100c is connected to an IC's output pin, the logic state of $S_{cb1}$ control signal is fixed at logic "0" so that only the output of the first selector 102 can pass through the selector 111a. The switching of $S_{cb2}$ control signal operates the selector 111b, whereby test data and its inversion are alternately output.

Therefore, the same effects as the first embodiment and as the second embodiment can be obtained by giving the same structure to every BSCC 100c and by changing the function of the BSCCs 100c with respect to their layout location. Production costs are expected to lower by means of mass production.

The invention claimed is:

1. A boundary scan cell circuit comprising:
   a logic signal input terminal at which an external logic signal enters said boundary scan cell circuit;
   a scan signal input terminal at which an external scan signal enters said boundary scan cell circuit;
   a scan signal output terminal at which a scan signal leaves said boundary scan cell circuit;
   an input logic signal storage which latches a logic signal from said logic signal input terminal for a predetermined length of time and outputs it;
   an XOR generator which generates the XOR of a logic signal from said input logic signal storage with a delay of a predetermined length of time and a current logic signal from said logic signal input terminal; and
   a scan selector which selects one of a scan signal from said scan signal input terminal and an XOR signal from said XOR generator according to the logic state of a control signal and outputs a signal thus selected to outside said boundary scan cell circuit through said scan signal output terminal.

2. The boundary scan cell circuit as in claim 1, further comprising:
   an input signal selector which selects one of a logic signal received from said logic signal input terminal and a scan signal received from said scan signal input terminal according to the logic state of a control signal and outputs a signal thus selected to said XOR generator;
   wherein:
   said scan selector's input is connected to said input signal selector's output as well as to said XOR generator's output;
   said input logic signal storage, formed by a flip-flop for holding an input logic signal whose input is connected to said scan selector's output and whose output is connected to said scan signal output terminal, outputs either one of an input logic signal and an XOR signal according to the logic state of a clock signal; and
   said scan signal output terminal is connected to a non-inverting output terminal of said flip-flop.

3. A boundary scan cell circuit comprising:
   a logic signal output terminal at which a logic signal is output,
   a scan signal input terminal at which an external scan signal enters said boundary scan cell circuit;
   a scan signal output terminal at which a scan signal leaves said boundary scan cell circuit;
   an input scan signal storage which latches a scan signal received from said scan signal input terminal for a predetermined length of time and outputs it;
   an inversion signal generator which accepts the output of said input scan signal storage and inverts it to give an inverted scan signal;
   an input signal selector whose input is connected to said scan signal input terminal as well as to said inversion signal generator and whose output is connected to said input scan signal storage, said input signal selector alternately selecting input scan signals from said scan signal input terminal and inverted scan signals from said inversion signal generator according to the logic state of a control signal and outputting a signal thus selected; and
   an alternate signal output unit which latches a signal selected by said input signal selector for a predetermined length of time and outputs it to outside said boundary scan cell circuit through said logic signal output terminal;

wherein said scan signal output terminal is connected to a signal line between said scan signal input terminal and said input signal selector.

4. The boundary scan cell circuit as in claim 3, wherein:

said input scan signal storage, inversion signal generator, and alternate signal output unit are formed by a flip-flop for holding an input scan signal having a non-inverting output terminal and an inverting output terminal, said flip-flop being capable of outputting the non-inverted signal of an input signal through said non-inverting output terminal or the inverted signal of an input signal through said inverting output terminal according to the logic state of a clock signal;

said logic signal output terminal is connected to said non-inverting output terminal of said flip-flop; and said input signal selector is a selector whose input is connected to said scan signal input terminal as well as to said inverting output terminal of said flip-flop and whose output is connected to an input terminal of said flip-flop.

5. The boundary scan cell circuit as in either claim 1 or claim 2 further including:

a logical signal output terminal at which a logical signal is output, an input scan signal storage which latches a scan signal received from said scan signal input terminal for a predetermined length of time and outputs it;

an inversion signal generator which accepts the output of said input scan signal storage and inverts it to give an inverted scan signal; and an output logic signal selector which accepts the output of said input scan signal storage and the output of said inversion signal generator, selects one of the scan signal and the inverted scan signal according to the logic state of a control signal, and outputs a signal thus selected to outside said boundary scan cell circuit through said logic signal output terminal.

6. In a boundary scan test circuit comprising (a) a plurality of integrated circuits each of which has an internal logic, an input pin at which an external logic signal enters said internal logic, and an output pin at which a logic signal leaves said internal logic; (b) a wire mount, disposed between the input pin of any one of said plurality of integrated circuits and the output pin of the other integrated circuit, onto which a wire, subjected to interconnection testing, is mounted; (c) input boundary scan cell circuits each disposed between the input pin of each of said plurality of integrated circuits and said internal logic of each of said plurality of integrated circuits; (d) output boundary scan cell circuits each disposed between the output pin of each of said plurality of integrated circuits and said internal logic of each of said plurality of integrated circuits; and (e) a scan path for connecting said boundary scan cell circuits in series, each of said input boundary scan cell circuits comprising:

a logic signal input terminal in connection with said input pin;

a scan signal input terminal for receiving a scan signal from said scan path;

a scan signal output terminal for providing a scan signal to said scan path;

an input logic signal storage which latches a logic signal from said logic signal input terminal for a predetermined length of time and outputs it;

an XOR generator which generates the XOR of a logic signal from said input logic signal storage with a delay of a predetermined length of time and a current logic signal from said logic signal input terminal; and a scan selector which selects one of a scan signal from said scan signal input terminal and an XOR signal from said XOR generator according to the logic state of a control signal and outputs a signal thus selected onto said scan path through said scan signal output terminal.

7. The boundary scan test circuit as in claim 6 further including:

an input signal selector which selects one of a logic signal received from said logic signal input terminal and a scan signal received from said scan signal input terminal according to the logic state of a control signal and outputs a signal thus selected to said XOR generator;

wherein:

said scan selector's input is connected to said input signal selector's output as well as to said XOR generator's output;

said input logic signal storage, formed by a flip-flop for holding an input logic signal whose input is connected to said scan selector's output and whose output is connected to said scan signal output terminal, outputs either one of an input logic signal and an XOR signal according to the logic state of a clock signal; and said scan signal output terminal is connected to a non-inverting output terminal of said flip-flop.

8. In a boundary scan test circuit comprising (a) a plurality of integrated circuits each of which has an internal logic, an input pin at which an external logic signal enters said internal logic, and an output pin at which a logic signal leaves said internal logic; (b) a wire mount, disposed between the input pin of any one of said plurality of integrated circuits and the output pin of the other integrated circuit, onto which a wire, subjected to interconnection testing, is mounted; (c) input boundary scan cell circuits each disposed between the input pin of each of said plurality of integrated circuits and said internal logic of each of said plurality of integrated circuits; (d) output boundary scan cell circuits each disposed between the output pin of each of said plurality of integrated circuits and said internal logic of each of said plurality of integrated circuits; and (e) a scan path for connecting said boundary scan cell circuits in series, each of said output boundary scan cell circuits comprising:

a logic signal output terminal in connection with said output pin;

a scan signal output terminal for providing a scan signal onto said scan path;

a scan signal input terminal for receiving a scan signal from said scan path;

an input scan signal storage which latches a scan signal from said scan signal input terminal for a predetermined length of time and outputs it;

an inversion signal generator which accepts the output of said input scan signal storage and inverts it to give an inverted scan signal;

an input signal selector whose input is connected to said scan signal input terminal as well as to said inversion signal generator and whose output is connected to said input scan signal storage, said input signal selector alternately selecting input scan signals from said scan signal input terminal and inverted scan signals from said inversion signal generator according to the logic state of a control signal and outputting a signal thus selected; and an alternate signal output unit which latches a signal selected by said input signal selector for a predetermined length of time and outputs it;

wherein said scan signal output terminal is connected to a signal line between said scan signal input terminal and said input signal selector.

9. The boundary scan test circuit as in claim 8, wherein:

said input scan signal storage, inversion signal generator, and alternate signal output unit are formed by a flip-flop for holding an input scan signal having a non-inverting output terminal and an inverting output terminal, said flip-flop being capable of outputting the non-inverted signal of an input signal through said non-inverting output terminal and the inverted signal of an input signal through said inverting output terminal;

said logic signal output terminal is connected to said non-inverting output terminal of said flip-flop; and said input signal selector is a selector whose input is connected to said scan signal input terminal as well as to said inverting output terminal of said flip-flop and whose output is connected to an input terminal of said flip-flop.

10. The boundary scan test circuit as in either claim 6 or claim 7, wherein:

an integrated circuit having therein said input boundary scan cell circuits has output boundary scan cell circuits, said each output boundary scan cell circuit comprising:

a logic signal output terminal in connection with said output pin;

a scan signal input terminal for receiving a scan signal from said scan path;

a scan signal output terminal for providing a scan signal to said scan path;

an input scan signal storage which latches a scan signal received from said scan signal input terminal for a predetermined length of time and outputs it;

an inversion signal generator which accepts the output of said input scan signal storage and inverts it to give an inverted scan signal;

an input signal selector whose input is connected to said scan signal input terminal as well as to said inversion signal generator and whose output is connected to said input scan signal storage, said input signal selector alternately selecting input scan signals from said scan signal input terminal and inverted scan signals from said inversion signal generator according to the logic state of a control signal and outputting a signal thus selected; and an alternate signal output unit which latches a signal selected by said input signal selector for a predetermined length of time and outputs it; wherein said scan signal output terminal is connected to a signal line between said scan signal input terminal and said input signal selector.

11. The boundary scan test circuit as in either claim 8 or claim 9, wherein:

an integrated circuit having therein said output boundary scan cell circuits has input boundary scan cell circuits, said each input boundary scan cell circuit comprising:

a logic signal input terminal in connection with said input pin;

a scan signal input terminal for receiving a scan signal from said scan path;

a scan signal output terminal for providing a scan signal to said scan path;

an input logic signal storage which latches a logic signal from said logic signal input terminal for a predetermined length of time and outputs it;

an XOR generator which generates the XOR of a logic signal from said input logic signal storage with a delay of a predetermined length of time and a current logic signal from said logic signal input terminal; and a scan selector which selects one of a scan signal from said scan signal input terminal and an XOR signal from said XOR generator according to the logic state of a control signal and outputs a signal thus selected onto said scan path through said scan signal output terminal.

12. In a boundary scan test circuit comprising (a) a plurality of integrated circuits each of which has an internal logic, an input pin at which an external logic signal enters said internal logic, and an output pin at which a logic signal leaves said internal logic; (b) a wire mount, disposed between the input pin of any one of said plurality of integrated circuits and the output pin of the other integrated circuit, onto which a wire, subjected to interconnection testing, is mounted; (c) input boundary scan cell circuits each disposed between the input pin of each of said plurality of integrated circuits and said internal logic of each of said plurality of integrated circuits; (d) output boundary scan cell circuits each disposed between the output pin of each of said plurality of integrated circuits and said internal logic of each of said plurality of integrated circuits; and (e) a scan path for connecting said boundary scan cell circuits in series, each of said input boundary scan cell circuit and said output boundary scan cell circuit comprising:

a logic signal input terminal having a structure capable of receiving a logic signal;

a scan signal input terminal for receiving a scan signal from said scan path;

a scan signal output terminal for providing a scan signal to said scan path;

an input logic signal storage which latches a logic signal from said logic signal input terminal for a predetermined length of time and outputs it;

an XOR generator which generates the XOR of a logic signal from said input logic signal storage with a delay of a predetermined length of time and a current logic signal from said logic signal input terminal;

a scan selector which selects one of a scan signal from said scan signal input terminal and an XOR signal from said XOR generator according to the logic state of a control signal and outputs a signal thus selected to said scan signal output terminal;

a logic signal output terminal at which a logic signal is output;

an input scan signal storage which latches a scan signal received from said scan signal input terminal for a predetermined length of time and outputs it;

an inversion signal generator which accepts the output of said input scan signal storage and inverts it to give an inverted scan signal;

an input signal selector whose input is connected to said scan signal input terminal as well as to said inversion signal generator and whose output is connected to said input scan signal storage, said input signal selector alternately selecting input scan signals from said scan signal input terminal and inverted scan signals from said inversion signal generator according to the logic state of a control signal and outputting a signal thus selected; and an alternate signal output unit which latches a signal selected by said input signal selector for a predetermined length of time and outputs it.

13. A boundary scan test method by the use of a boundary scan test circuit comprising: (a) a plurality of integrated circuits each of which has an internal logic, an input pin at which an external logic signal enters said internal logic, and an output pin at which a logic signal leaves said internal logic; (b) input boundary scan cell circuits each disposed between the input pin of each of said plurality of integrated circuits and said internal logic of each of said plurality of integrated circuits; (c) output boundary scan cell circuits each disposed between the output pin of each of said plurality of integrated circuits and said internal logic of each of said plurality of integrated circuits; and (d) a scan path for connecting said boundary scan cell circuits in series, said method comprising the steps of:

connecting a wire subjected to testing between the output pin of at least one of said plurality of integrated circuits and the input pin of another integrated circuit;

making said output boundary scan cell circuit in connection with the output pin of said integrated circuit supply non-inverted logic signals and inverted logic signals one after the other at predetermined intervals;

latching a logic signal, applied to said input boundary scan cell circuit connected to the input pin of said integrated circuit, for a predetermined length of time;

generating the XOR of a current logic signal input at said input pin and a previous logic signal with a delay of a predetermined length of time; and selecting one of an incoming scan signal and an XOR signal for scan-out of a signal thus selected onto said scan path.

14. A boundary scan test method by the use of a boundary scan test circuit comprising: (a) a plurality of integrated circuits each of which has an internal logic, an input pin at which an external logic signal enters said internal logic, and an output pin at which a logic signal leaves said internal logic; (b) input boundary scan cell circuits each disposed between the input pin of each of said plurality of integrated circuits and said internal logic of each of said plurality of integrated circuits; (c) output boundary scan cell circuits each disposed between the output pin of each of said plurality of integrated circuits and said internal logic of each of said plurality of integrated circuits; and (d) a scan path for connecting said boundary scan cell circuits in series, said method comprising the steps of:

connecting a wire subjected to testing between the output pin of at least one of said plurality of integrated circuits and the input pin of another integrated circuit;

performing scan-in of a scan signal applied to said output boundary scan cell circuit in connection with the output pin of said integrated circuit, and latching same for a predetermined length of time;

inverting such a scan signal thus latched to give an inverted scan signal; and alternately selecting an current input scan signal to said output boundary scan cell circuit and a previous, inverted scan signal so as to apply a signal thus selected to said wire subjected to testing.

* * * * *

UNITED STATES PATENT AND TRADEMARK OFFICE
CERTIFICATE OF CORRECTION

PATENT NO. : 5,450,415
DATED : September 12, 1995
INVENTOR(S) : Takehiro Kamada

It is certified that error appears in the above-indentified patent and that said Letters Patent is hereby corrected as shown below:

Column 2, Line 21: "$S_{scan}$" should read --$S_{scan}$ scan--, and "signal scan" should read --signal--.

Column 4, Line 57: "tile" should read --the--.

Column 7, Line 58: "output input" should read --output and input--.

Column 12, Line 15: "flip-Flop" should read --flip-flop--.

Signed and Sealed this

Nineteenth Day of November, 1996

Attest:

BRUCE LEHMAN

Attesting Officer     Commissioner of Patents and Trademarks